United States Patent
Lim et al.

(10) Patent No.: US 8,330,551 B2
(45) Date of Patent: Dec. 11, 2012

(54) DUAL BAND HIGH FREQUENCY AMPLIFIER USING COMPOSITE RIGHT/LEFT HANDED TRANSMISSION LINE

(75) Inventors: Jongsik Lim, Daejeon (KR); Dal Ahn, Chungcheongnam-do (KR)

(73) Assignee: Soonchunhyang University Industry Academy Cooperation Foundation, Chungcheongnam-do (KR)

( * ) Notice: Subject to any disclaimer, the term of this patent is extended or adjusted under 35 U.S.C. 154(b) by 343 days.

(21) Appl. No.: 12/833,183

(22) Filed: Jul. 9, 2010

(65) Prior Publication Data
US 2011/0115558 A1    May 19, 2011

(30) Foreign Application Priority Data
Nov. 18, 2009   (KR) .................. 10-2009-0111224

(51) Int. Cl.
*H03H 7/38*   (2006.01)
*H01P 3/08*   (2006.01)

(52) U.S. Cl. ............. 333/33; 333/185; 330/302
(58) Field of Classification Search ............ 333/33, 333/32, 185; 330/302
See application file for complete search history.

(56) References Cited

U.S. PATENT DOCUMENTS
8,232,853 B2 *   7/2012   Ryou et al. ............. 333/246

OTHER PUBLICATIONS

C. Caloz, et al., "Unusual Propagation Characteristics in CRLH Structures", Proc. IEEE AP-S International Symposium, pp. 3549-3552, Monterey, CA, Jun. 2004.
I. Hsiang Lin, et al., "Arbitrary Dual-Band Components Using Composite Right/Left-Handed Transmission Lines", IEEE Trans. on Microw. Theory Tech., vol. 52, No. 4, pp. 1142-1149, Apr. 2004.
Seung Hun Ji et al., "Concurrent Dual-Band Class-E Power Amplifier Using Composite Right/Left-Handed Transmission Lines", IEEE Transactions on Microwave Theory and Techniques, vol. 55, No. 6, pp. 1341-1347, Jun. 2007.

* cited by examiner

*Primary Examiner* — Stephen Jones
(74) *Attorney, Agent, or Firm* — Dickstein Shapiro LLP

(57) ABSTRACT

Disclosed herein is a dual band high frequency amplifier using a composite right/left handed (CRLH) transmission line (TL). Accordingly, a CRLH TL structure having a dual band characteristic is inserted into an input matching circuit and/or an output matching circuit in the high frequency amplifier, and a matching circuit is designed so that impedance matching is performed at two frequencies, thereby obtaining both gain and matching characteristics at the two frequencies.

5 Claims, 16 Drawing Sheets

:CHIP CAPACITOR     :CHIP INDUCTOR

:PLANAR TRANSMISSION LINE PAD

N = M + 1

DUAL BAND HIGH FREQUENCY AMPLIFIER USING COMPOSITE RIGHT/LEFT HANDED TRANSMISSION LINE

CROSS-REFERENCE TO RELATED APPLICATION

This application claims priority from and the benefit of Korean Patent Application No. 10-2009-111224, filed on Nov. 18, 2009, which is hereby incorporated by reference for all purposes as if fully set forth herein.

BACKGROUND

1. Field of the Invention

Disclosed herein is a high frequency amplifier. More particularly, disclosed herein is a dual band high frequency amplifier using a composite right/left handed (CRLH) transmission line (TL), in which an input matching circuit and/or an output matching circuit in the high frequency amplifier are formed using the CRLH TL, thereby obtaining both gain and matching characteristics at two frequencies.

2. Description of the Related Art

A transmission line (TL) that allows electromagnetic waves to be transmitted has a variety of physical forms. However, the TL is generally represented as an equivalent circuit, as shown in FIG. 1, which includes a serial inductor having inductance $L_R$ per unit length and a shunt capacitor having capacitance $C_R$.

An ideal TL has an all-pass characteristic. However, a practical TL has a low-pass characteristic with a specific cutoff frequency because of the loss of the TL itself and the limitation of the maximum operating frequency due to parasitic components. When the values of elements and parasitic components in a unit equivalent circuit are very small, the cutoff frequency of the TL is considerably high. Therefore, the low-pass characteristic of the TL seems to be the all-pass characteristic in a frequency to be practically applied.

As shown in FIG. 1, an equivalent circuit that includes a serial inductor having inductance $L_R$ per unit length of a TL and a shunt capacitor having capacitance $C_R$ may be represented as a T-shaped symmetric equivalent circuit that includes two serial inductors each having inductance $L_R/2$ per unit length of the TL and a shunt capacitor having capacitance $C_R$.

The TL may have a structure in which the positions of the serial inductance and the shunt capacitor in the equivalent circuit shown in FIG. 1 are switched to each other, i.e., a TL structure represented by a serial capacitor having capacitance $C_L$ and a shunt inductor having inductance $L_L$ as shown in FIG. 2. When compared with a general TL structure, such a TL structure has a characteristic that the propagating directions of group and phase velocities are opposite to each other. Such a TL is referred to as a left handed (LH) TL.

As shown in FIG. 2, the unit equivalent circuit of the LH TL, that includes a serial capacitor having capacitance $C_L$ and a shunt inductance having inductance $L_L$, may be represented as a T-shaped symmetric equivalent circuit that includes two serial capacitors each having capacitance $2C_L$ and a shunt inductor having inductance $L_L$.

In order to be compared with the LH TL shown in FIG. 2, the general TL represented as the equivalent circuit shown in FIG. 1 is referred to as a right handed (RH) TL. A general RH TLs include a single- or multi-layer microstrip TL, a stripline TL, a coplanar waveguide (CPW) TL, a coplanar strip (CPS) TL, and so on.

Meanwhile, there exists a TL structure in which the structures of LH and RH TLs are mixed together. Such TL structure is referred to as a composite right/left handed (CRLH) TL structure (C. Caloz, C. Allen, and T. Itoh, "Unusual Propagation Characteristics in CRLH Structures," in Proc. IEEE AP-S International Symposium, pp. 3549-3552, Monterey, Calif., June 2004). The CRLH TL structure is generally configured so that LH and RH TL structures are intentionally mixed together. However, in the practical application of an LH TL structure, the physical basis for interconnection is an RH TL structure. Therefore, if the LH TL structure is connected to or inserted into the RH TL structure, a CRLH TL structure can be consequently formed without making special efforts to implement the RH TL structure.

Such a CRLH TL structure basically has dual band characteristics originated from phase characteristics of the RH and LH TL structures. Thus, the CRLH TL structure can be used as a TL that requires a dual band, and research papers for the CRLH TL structure have been reported recently.

However, the dual band properties of the CRLH TL are not applied to high frequency active circuits such as amplifiers but limited to only passive circuits. This is because the passive circuits are mostly implemented with TLs, and if CRLH TLs are used in the passive circuits, passive circuits having dual band characteristics can be designed directly.

So far, no dual band amplifier using a CRLH TL has been reported.

SUMMARY OF THE INVENTION

Disclosed herein is a dual band high frequency amplifier in which a matching circuit suitable for dual band operation is designed using a composite right/left handed (CRLH) transmission line (TL) structure, thereby obtaining both gain and matching characteristics in dual bands.

In one embodiment, there is provided a dual band high frequency amplifier using a CRLH TL, the amplifier including: an amplifier element having an amplification function; and a matching circuit having an impedance matching function of the amplifier element, wherein the matching circuit has one or more serial CRLH TLs and one or more shunt stubs, formed on a substrate, the serial CRLH TL has a plurality of unit left handed (LH) and right handed (RH) TLs, and the unit LH TL has serial capacitors and shunt inductors, thereby obtaining both gain and matching characteristics in a dual band.

The matching circuit may be any one of a matching circuit disposed at an input port of the amplifier element, a matching circuit disposed at an output port of the amplifier element, and matching circuits respectively disposed at the input and output ports of the amplifier elements.

The plurality of unit LH TLs may include one or more of one or more serial capacitors with variable capacitance and one or more shunt inductors with variable inductance.

The shunt stub may be connected to a plurality of shunt stubs at one node and disposed while being spaced apart at predetermined angles.

The RH TL may include any one of a microstrip TL, a stripline TL, a coplanar waveguide (CPW) TL and a coplanar strip (CPS) TL.

BRIEF DESCRIPTION OF THE DRAWINGS

The above and other aspects, features and advantages disclosed herein will become apparent from the following description of preferred embodiments given in conjunction with the accompanying drawings, in which:

FIG. 12a is a plane view of the dual band high frequency amplifier, in which the matching circuit is configured with the CRLH TL, and FIG. 12b is an enlarged plane view of the matching circuit, and FIG. 12c is a diagram showing the layout of a matching circuit in the dual band high frequency amplifier using the CRLH TL according to an embodiment.

DETAILED DESCRIPTION OF THE INVENTION

Figure 1:
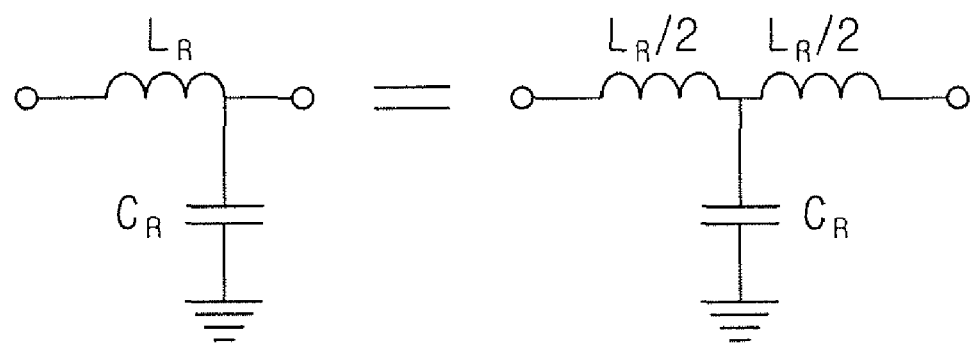
FIG. 1 is an equivalent circuit diagram of general right handed (RH) transmission lines (TLs) for electromagnetic waves, which is represented by lumped elements and an equivalent circuit obtained by modifying it into a symmetric equivalent circuit.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Hereinafter, a dual band high frequency amplifier using a composite right/left handed (CRLH) TL according to an embodiment will be described in detail with reference to the accompanying drawings.

Figure 2:
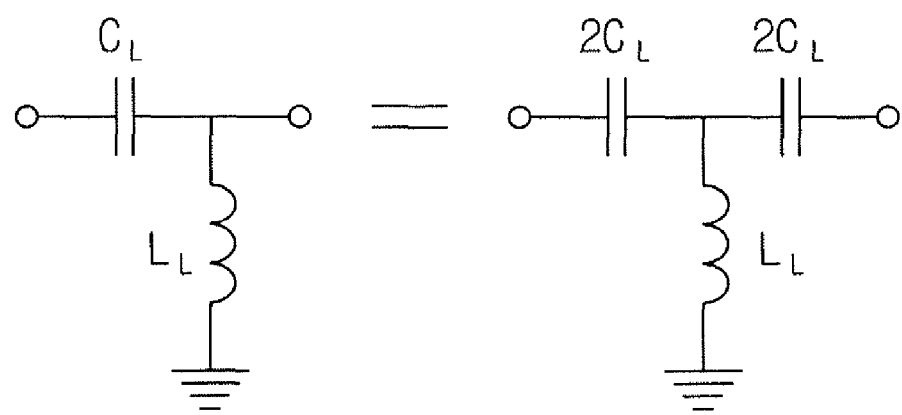
FIG. 2 is an equivalent circuit diagram of left handed (LH) TLs, which is represented by lumped elements and an equivalent circuit obtained by modifying it into a symmetric equivalent circuit.

A left handed (LH) TL structure may exist through a slightly artificial design and manufacturing process so as to be represented as the equivalent circuit shown in FIG. 2. Therefore, the LH TL structure has a phase characteristic different from that of the general right handed (RH) TL structure.

Figure 3A:
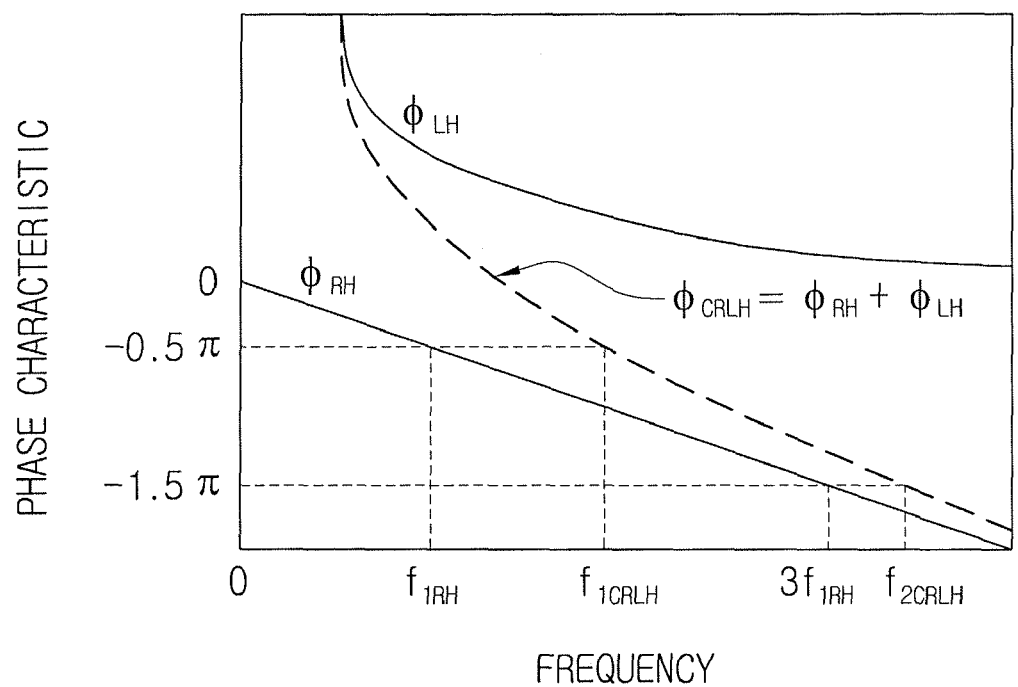
FIG. 3a is a graph showing phase characteristics of an ideal right handed (RH) TL, an ideal LH TL and an ideal composite right/left handed (CRLH) TL.
Figure 3B:
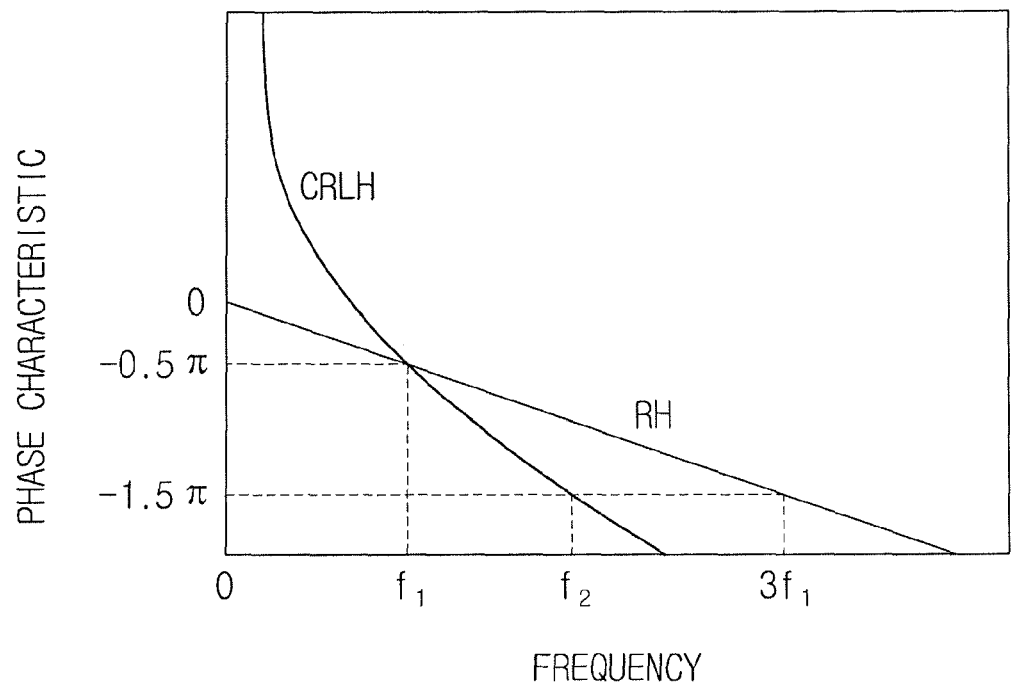
FIG. 3b is a graph showing the phase characteristic obtained when the frequency at which the phases of RH and CRLH TLs becomes 90 degrees corresponds to one frequency $f_1$.

FIGS. 3a and 3b are graphs showing phase characteristics of TLs. Here, FIG. 3a is a graph showing phase characteristics of an ideal RH TL, an ideal LH TL and an ideal CRLH TL, and FIG. 3b is a graph showing the phase characteristic obtained when the frequency at which the phases of RH and CRLH TLs becomes 90 degrees corresponds to one frequency $f_1$.

Referring to FIG. 3a, phase characteristics of RH, LH and CRLH TLs are shown. That is, the phase characteristic of the RH TL that is the general TL structure is linear. Thus, the obvious estimation is possible. Therefore, the RH TL has an electrical length (phase angle) in proportion to a frequency with respect to a given physical length. If it is assumed that the frequency with a phase angle of $0.5\pi$ is $f_{1RH}$ in the RH TL with a fixed physical length, the frequency with a phase angle of $1.5\pi$ becomes $3f_{1RH}$ that is three times greater than $f_{1RH}$. On the contrary, the phase characteristic of the LH TL is nonlinear. Therefore, in the CRLH TL that reflects the phase characteristic of the LH transmission, it is assumed that the frequency with a phase angle of $0.5\pi$ is $f_{1CRLH}$ with respect to a fixed physical length. Then, that is a frequency with a phase angle of $1.5\pi$ is not identical to $3f_{1CRLH}$. That is, the CRLH TL including the LH TL has a difference in that "$f_{2CRLH} \neq 3f_{1CRLH}$"

Referring to FIG. 3b, when the RH and CRLH TLs are configured to have the same electrical length of $0.5\pi$ at frequency $f_1$, their frequencies with a phase angle of $1.5\pi$ are not identical to each other. That is, the frequency with the phase angle of $1.5\pi$ is $3f_1$ that is three times greater than $f_1$ in the RH TL, but the frequency with the phase angle of $1.5\pi$ is becomes $f_2$ that is greater than $f_1$ and smaller than $3f_1$ in the CRLH TL. Therefore, in the CRLH TL, $f_2$ does not have the rate that is three times greater than $f_1$ but has an arbitrary rate.

Thus, when two frequencies in a desired dual band do not have an integer-time rate but has an arbitrary rate, characteristics of the dual band can be obtained not by using the RH TL but by using the CRLH TL.

Accordingly, a high frequency amplifier having a desired gain characteristic in the dual band can be configured by forming a CRLH TL with an electrical length required at the dual band frequency and designing a matching circuit including the CRLH TL.

Figure 4:
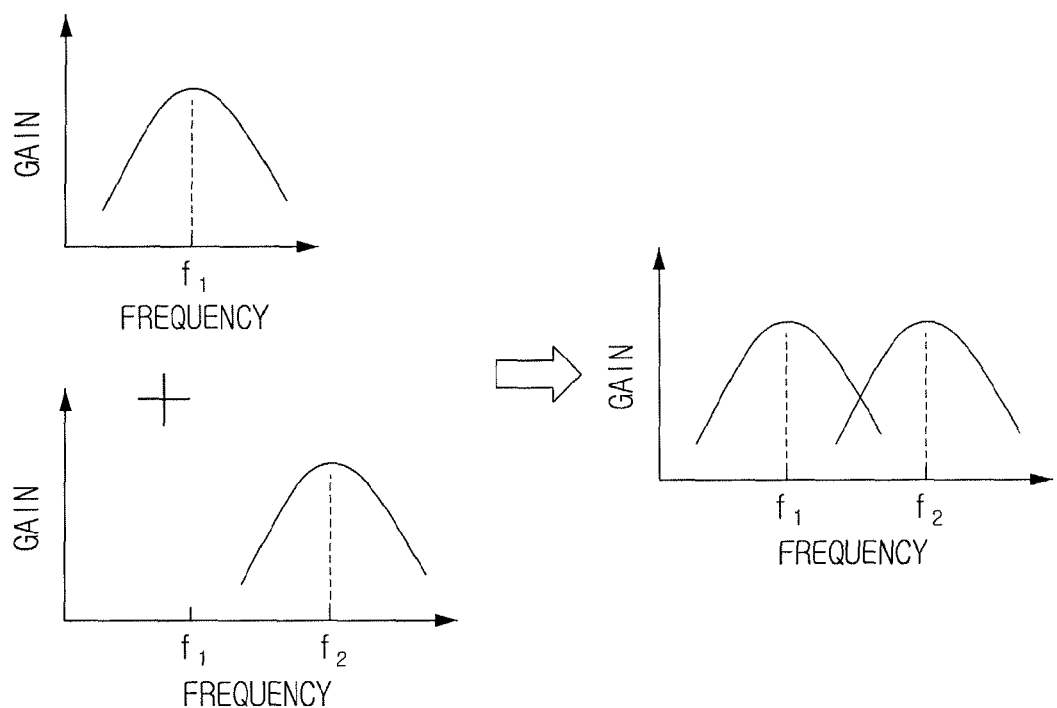
FIG. 4 is a conceptual diagram showing a frequency response having gains respectively obtained from dual band frequencies $f_1$ and $f_2$.

FIG. 4 is a conceptual diagram showing a frequency response having gains respectively obtained from dual band frequencies.

Referring to FIG. 4, there exist two amplifiers (not shown) respectively having arbitrary gains at two different frequencies $f_1$ and $f_2$. If the amplification characteristic at the two frequencies $f_1$ and $f_2$ is obtained using one amplifier, the frequency response is not a frequency response obtained by composing the gain characteristics at the two frequencies $f_1$ and $f_2$ as a vector but a frequency response obtained by composing the gain characteristics at the two frequencies $f_1$ and $f_2$ in the state that they are independently maintained as they are.

Figure 5:
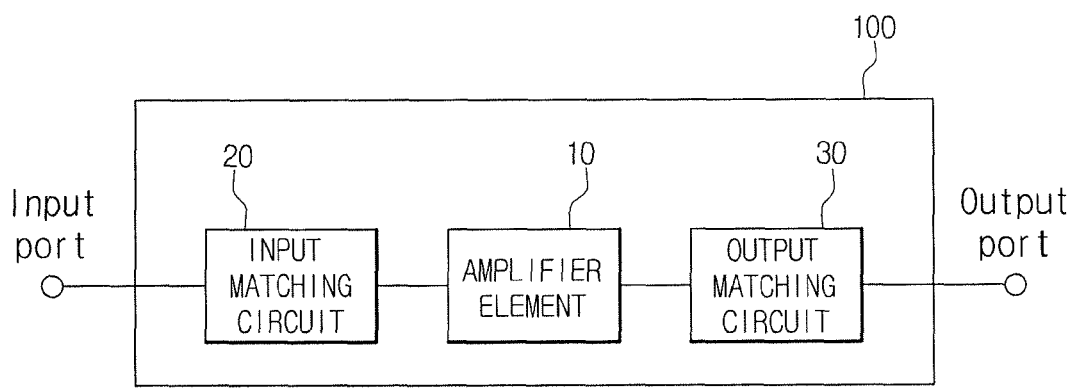
FIG. 5 is a block diagram schematically showing the configuration of a dual band high frequency amplifier using a CRLH TL according to an embodiment.

FIG. 5 is a block diagram schematically showing the configuration of a dual band high frequency amplifier using a CRLH TL according to an embodiment.

Referring to FIG. 5, the dual band high frequency amplifier 100 using the CRLH TL includes an amplifier element 10, e.g., a transistor that amplifies an input signal inputted from an input port.

An input matching circuit 20 and an output matching circuit 30 are electrically connected to input and output ports of the amplifier element 10, respectively. The input matching circuit 20 is a matching circuit that has a matching characteristic at two frequencies and matches input impedance. The output matching circuit 30 is a matching circuit that has a matching characteristic at two frequencies and matches output impedance.

Meanwhile, although not shown in this figure, the input matching circuit 20 may be electrically connected to the input port of the amplifier element 10, but the output matching circuit 30 may not be electrically connected to the output port of the amplifier element 10. Alternatively, the input matching circuit 20 may not be electrically connected to the input port of the amplifier element 10, but the output matching circuit 30 may be electrically connected to the output port of the amplifier element 10. In order to avoid repetition of description for convenience of illustration, detailed descriptions will be omitted.

Figure 6:
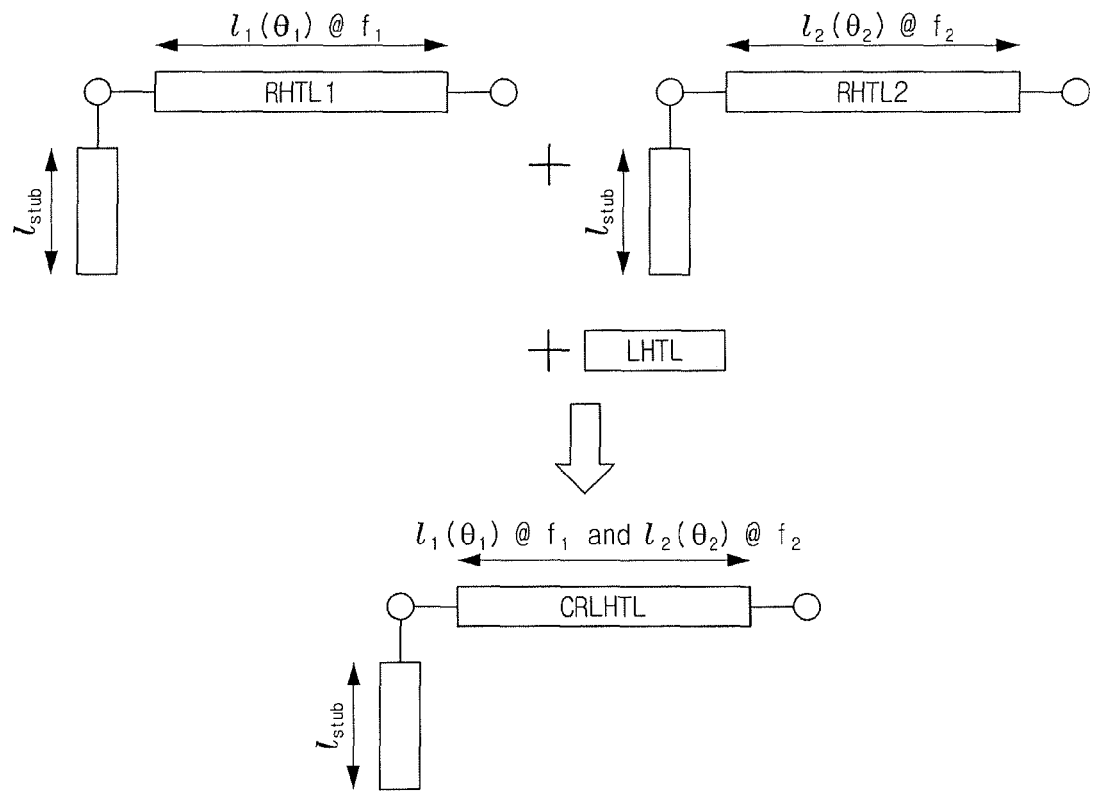
FIG. 6 is a diagram illustrating the principle that a matching circuit of the dual band high frequency amplifier is formed using dual band characteristics of a CRLH TL configured with RH and LH TLs.

FIG. 6 is a diagram illustrating the principle that a matching circuit of the dual band high frequency amplifier is formed using dual band characteristics of a CRLH TL configured with RH and LH TLs.

Referring to FIG. 6, the matching circuit of the dual band high frequency amplifier using the CRLH TL will be described in detail with reference to FIG. 6. It is assumed that, as illustrated in FIG. 6, there exist a first matching circuit (not shown) of an amplifier Amp1 having a gain at frequency $f_1$ and a second matching circuit (not shown) of an amplifier Amp2 having a gain at frequency $f_2$, and each of the matching circuits is configured into an L-section structure having a shunt stub. In the first matching circuit, the length of a serial RH TL RHTL1 is $l_1$ (electrical length $\theta_1$), and the length of a shunt stub is $l_{stub}$. In the second matching circuit, the length of a serial RH TL RHTL2 is $l_2$ (electrical length $\theta_2$), and the length of a shunt stub is $l_{stub}$.

When the amplifiers Amp1 and Amp2 are individually manufactured, to each of the amplifiers Amp1 and Amp2 has a unique gain response at the frequencies $f_1$ and $f_2$ as shown in FIG. 4.

Meanwhile, it is assumed that a matching circuit for dual band high frequency amplifier is configured into an L-section structure having a shunt stub. Also, in the matching circuit for dual band high frequency amplifier, it is assumed that the length of a CRLH TL CRLHTL is $l_1$ (electrical length $\theta_1$) at the frequency $f_1$, the length of the CRLH TL CRLHTL is $l_2$ (electrical length $\theta_2$) at the frequency $f_2$, and the length of the shunt stub is $l_{stub}$. Then, the phase characteristic of such a CRLH TL can be shown in FIG. 7.

Figure 7:
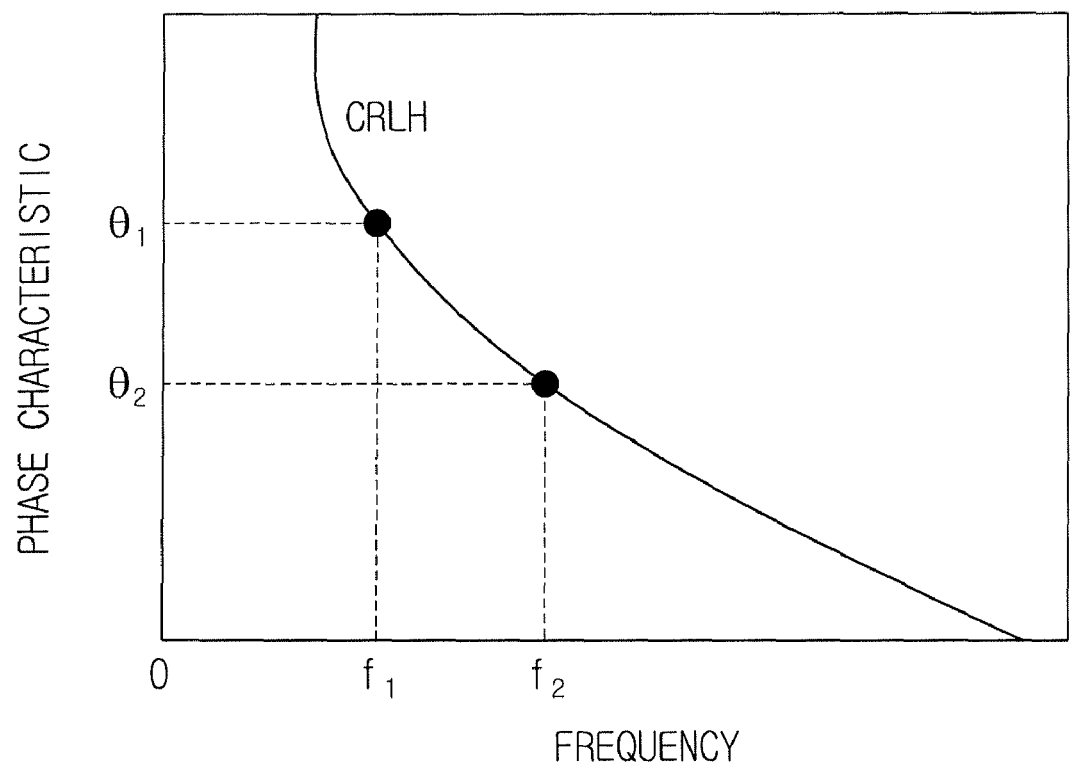
FIG. 7 is a graph showing the phase characteristic obtained when one CRLH TL has electrical lengths $\theta_1$ and $\theta_2$ respectively at two frequencies $f_1$ and $f_2$ in the dual band high frequency amplifier.

FIG. 7 is a graph showing the phase characteristic obtained when one CRLH TL has electrical lengths $\theta_1$ and $\theta_2$ respectively at two frequencies $f_1$ and $f_2$ in the dual band high frequency amplifier.

As described above, in the RH TL, the frequency $f_2$ with the electrical length $\theta_2$ is determined by the proportional relation between the electrical lengths $\theta_1$ and $\theta_2$. Hence, the relation of $f_2 = f_1 \theta_2 / \theta_1$ always exists. Therefore, in order that the electrical length at the frequency $f_2$ becomes $\theta_2$ when the relation of $f_2 = f_1 \theta_2 / \theta_1$ does not exists, its implementation is necessarily performed using the CRLH TL. This is because its implementation cannot be performed using the RH TL.

Although the relatively simple structure of the matching circuit like the L-section structure having a shunt stub has been described as an example, it will be readily understood by those skilled in the art that the technical spirit described with reference to FIG. 6 is identically applied to a matching circuit that includes two or more shunt stubs. That is, the technical spirit described with reference to FIG. 6 is a technical spirit in that the CRLH TL having the dual band characteristic is inserted into a certain portion of the matching circuit, thereby obtaining a dual band matching characteristic.

Thus, in order to have a dual band characteristic that an amplifier element simultaneously has gains at two frequencies $f_1$ and $f_2$, the matching circuit may be designed using the CRLH TL. At this time, the matching circuit necessarily performs matching at both of the frequencies $f_1$ and $f_2$. Therefore, the matching circuit is designed into a CRLH TL structure so that a serial TL in the matching circuit has an electrical length $\theta_1$ at the frequency $f_1$ and an electrical length $\theta_2$ at the frequency $f_2$.

In this case, matching circuits may be previously designed respectively at two frequencies $f_1$ and $f_2$ so that shunt stubs have the same physical length $l_{stub}$ at the two frequencies $f_1$ and $f_2$. However, this is provided for illustrative purposes, and it will be readily understood by those skilled in the art that the shunt stubs may have different lengths as long as there is a sufficient margin of performance, in which slight mismatching is negligible even though they have different physical lengths at the two frequencies $f_1$ and $f_2$.

If the matching circuit is designed and the amplifier element is configured in the dual band, the matching is performed at both of the frequencies $f_1$ and $f_2$. Thus, the gain and matching characteristics in the two amplifiers Amp1 and Amp2 can be simultaneously obtained using an amplifier.

In order to experimentally verify the validity of the method disclosed herein, a dual band amplifier operated at two frequencies ($f_1$=1830 MHz and $f_2$=2340 MHz) will be proposed as an embodiment. To this end, amplification characteristics are observed by forming amplifiers Amp1 and Amp2 respectively matched at frequencies ($f_1$=1830 MHz and $f_2$=2340 MHz) and then evaluating S-parameters that show the performances of the respective amplifiers Amp1 and Amp2.

Figure 8A:
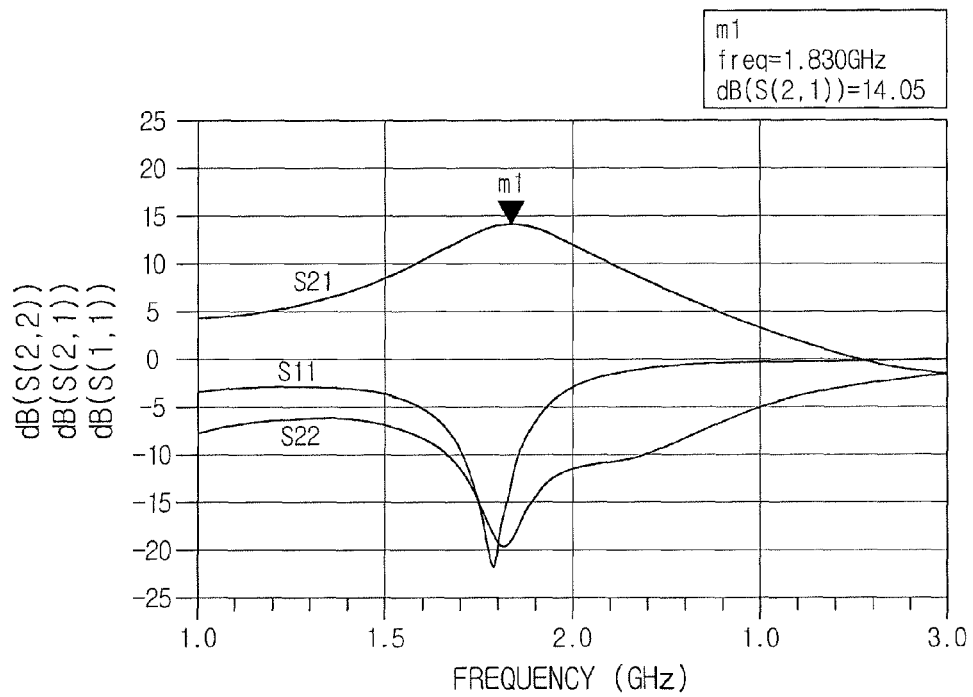
FIG. 8a is a graph showing the characteristic of a first amplifier (Amp1) operated at a first center frequency ($f_1$=1830 MHz), according to an embodiment.
Figure 8B:
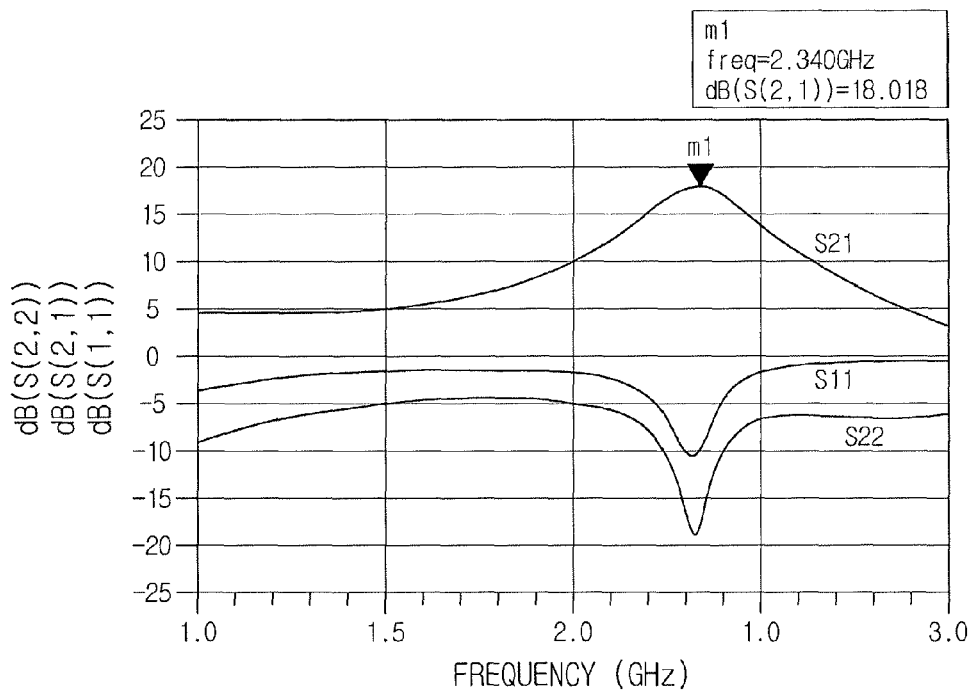
FIG. 8b is a graph showing the characteristic of a second amplifier (Amp2) operated at a second center frequency ($f_2$=2340 MHz), according to an embodiment.

FIGS. 8a and 8b are graphs showing gain characteristics of two amplifiers respectively operated at two frequencies. Here, FIG. 8a is a graph showing the characteristic of a first amplifier Amp1 operated at a first center frequency ($f_1$=1830 MHz), and FIG. 8b is a graph showing the characteristic of a second amplifier Amp2 operated at a second center frequency ($f_2$=2340 MHz).

As shown in FIGS. 8a and 8b, the gains of the amplifiers Amp1 and Amp2 are 14.05 dB and 18.018 dB at the center frequencies in corresponding operational bands, respectively. The matching characteristics (S11 and S22) show satisfactory matching at corresponding frequencies.

As a matching circuit is designed to actually implement the embodiment, the electrical lengths $\theta_1$ and $\theta_2$ of a serial TL are 110 degrees and 88 degrees, respectively. Thus, it can be seen that the length of the serial TL in the matching circuit, required at the two frequencies $f_1$ and $f_2$ has no special correlation with the ratio ($f_2/f_1$) of the frequencies $f_1$ and $f_2$. If a CRLH TL implemented to have phase angles respectively required at the two frequencies $f_1$ and $f_2$ is inserted into the matching circuit, the dual band operation can be obtained using an amplifier.

In this embodiment, an LH TL for the CRLH TL is configured using the method proposed in the well-known research paper of Lin (I. H. Lin, M. DeVincentis, C. Caloz, and T. Itoh, "Arbitrary Dual-Band components Using Composite Right/Left-Handed TLs," IEEE Trans. On Microw. Theory Tech., Vol. 52, No. 4, pp. 1142-1149, April 2004).

The technical spirit proposed in the research paper of Lin merely describes the dual band characteristic of the CRLH TL and shows branch line coupler (BLC) that is an application example of a high frequency passive circuit by using the dual band characteristic. Also, in the research paper of Lin, a passive circuit can be designed to have a dual band characteristic only at two frequencies typically standardized, i.e., two frequencies at which the electrical lengths of the CRLH TL respectively correspond to $\pi/2$ and $3\pi/2$ as shown in the following Expression 1 and 2 described in the research paper of Lin. As an example, a dual band BLC is disclosed in the research paper of Lin.

$$\phi_C(f_1) = -\frac{\pi}{2} \quad (1)$$

$$\phi_C(f_1) = -\frac{3\pi}{2} \quad (2)$$

However, in this embodiment, the gain and matching characteristics of the dual band are proposed in the configuration of the high frequency amplifier that is a high frequency active circuit having a high degree of difficulty in configuration as compared with the passive circuit. Also, it can be seen that the dual band amplifier is designed even when the electrical lengths of the CRLH TL do not typically have $\pi/2$ and $3\pi/2$ but have arbitrary angles at the two frequencies in the dual band, respectively. Since it is apparent that the electrical lengths of the TL included in the matching circuit of the dual band amplifier do not typically have $\pi/2$ and $3\pi/2$ but have arbitrary angles at the two desired frequencies, respectively, the dual band amplifier is configured by substituting arbitrary electrical lengths for $\pi/2$ and $3\pi/2$ in the technical spirit disclosed in the research paper of Lin, particularly in Expressions 1 and 2. Therefore, it is true that this embodiment is considerably improved in the technical spirit as compared with the research paper of Lin. The following Expressions 3 and 4 are obtained by continuously progressing Expressions 1 and 2 disclosed in the research paper of Lin.

$$P \approx \frac{\pi}{2} \frac{3f_2 - f_1}{f_2^2 - f_1^2} \quad (3)$$

$$Q \approx \frac{\pi}{2} \frac{\frac{3}{f_2} - \frac{1}{f_1}}{\frac{1}{f_1^2} - \frac{1}{f_2^2}} \quad (4)$$

However, in this embodiment, arbitrary $\psi_1$ and $\psi_2$ are respectively used as the electrical lengths at the two frequencies in the matching circuit of the dual band amplifier. Therefore, the following Expressions 5 and 6 are used rather than Expressions 3 and 4

$$P = \frac{\psi_2 f_2 - \psi_1 f_1}{f_2^2 - f_1^2} \quad (5)$$

$$Q = \frac{\frac{\psi_2}{f_2} - \frac{\psi_1}{f_1}}{\frac{1}{f_1^2} - \frac{1}{f_2^2}} \quad (6)$$

Also, it will be readily understood by those skilled in the art that the dual band amplifier is not completed by simply inserting the CRLH TL into the matching circuit of the amplifier, but the dual band amplifier is completed by designing the matching circuit to which the technical spirit is added so that satisfactory matching is performed in the dual band.

Figure 9A:
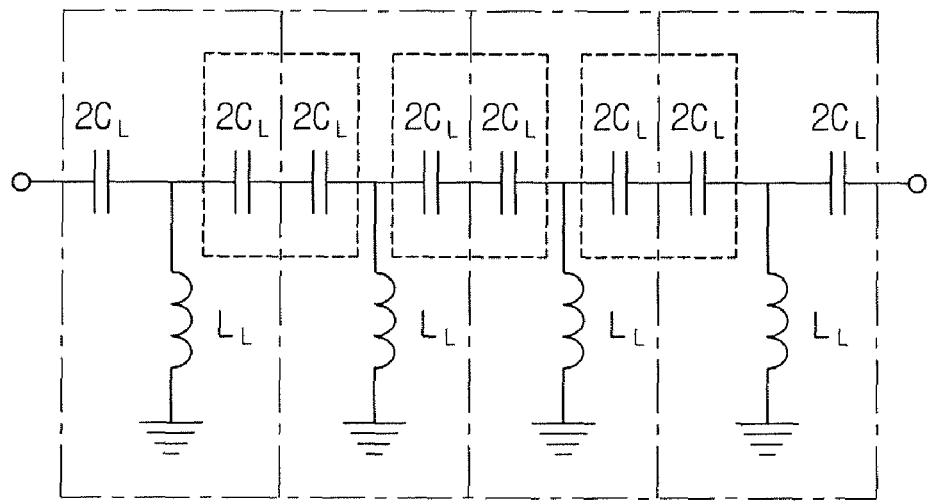
FIG. 9a is a diagram showing the equivalent circuit of a four-stage LH TL.
Figure 9B:
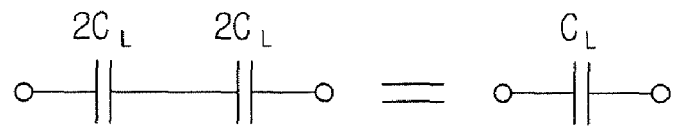
FIG. 9b is a diagram illustrating that when two identical capacitors are connected in series to each other, the composite capacitance of the capacitors becomes a half of the capacitance of each of the capacitors.
Figure 9C:
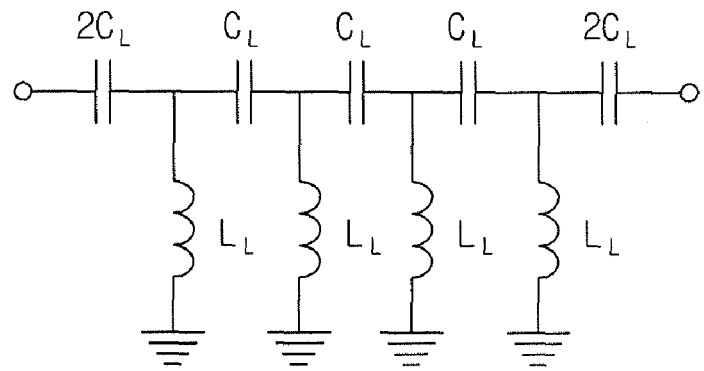
FIG. 9c is a diagram illustrating that two capacitors connected in series to each other, shown in FIG. 9a, can be replaced with one capacitor.

FIGS. 9a and 9b are diagrams showing equivalent circuits of an LH TL. Here, FIG. 9a is a diagram showing the equivalent circuit of a four-stage LH TL, FIG. 9b is a diagram illustrating that when two identical capacitors are connected in series to each other, the composite capacitance of the capacitors becomes a half of the capacitance of each of the capacitors, and FIG. 9c is a diagram illustrating that two capacitors connected in series to each other, shown in FIG. 9a, can be replaced with one capacitor.

Referring to FIGS. 9a and 9b, in this embodiment, a dual band CRLH TL required in a desired amplifier is configured using four unit LH TLs as shown in FIG. 2. The four unit LH TLs connected in series to one another may be represented as an equivalent circuit shown in FIG. 9a. Two adjacent capacitors exist in three rectangles designated by heave broken line. Here, the two capacitors are connected in series to each other and each of the two capacitors has a capacitance of $2C_L$. As shown in FIG. 9b, the total capacitance of the two adjacent capacitors becomes a capacitance $C_L$ that is a half of the capacitance $2C_L$ of each of the two adjacent capacitors. Therefore, the equivalent circuit shown in FIG. 9a may be simplified an equivalent circuit as shown in FIG. 9c.

Meanwhile, it will be apparent that the number of the unit LH TLs is one or more so as to have a passband capable of sufficiently supporting the passbands of two desired frequencies.

Figure 10:
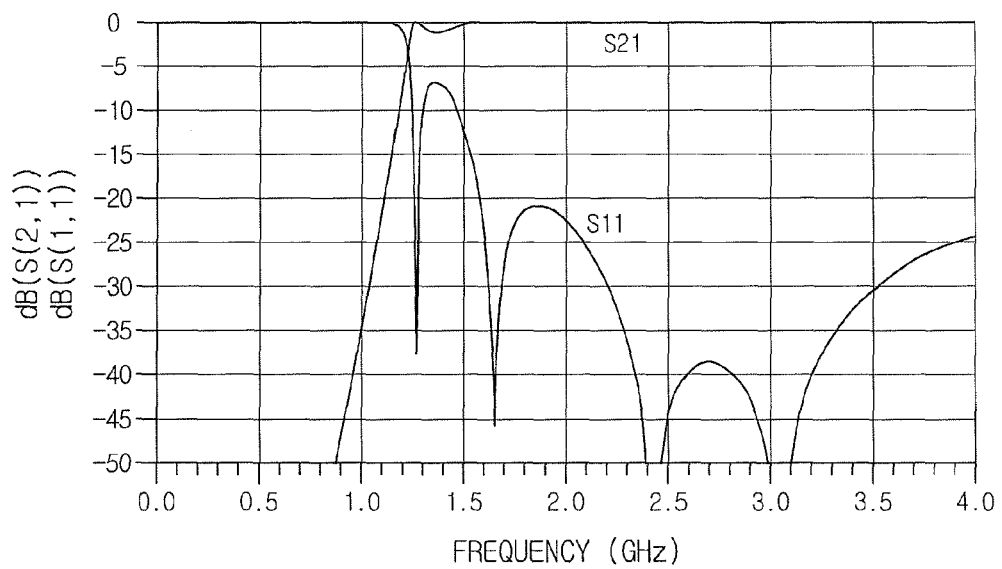
FIG. 10 is a graph showing transmission characteristics of the four-stage LH TL using S-parameters.

FIG. 10 is a graph showing transmission characteristics of the four-stage LH TL using S-parameters.

In this embodiment, the inductance $L_L$ and the capacitance $C_L$, determined to configure the dual band CRLH TL, are 3.9 nH and 1.2 pF, respectively. The pass characteristic S21 of such a structure is shown in FIG. 10. Here, the cutoff frequency band that cuts off the passage of a signal is 1250 MHz or lower, and the two frequencies ($f_1$=1830 MHz and $f_2$=2340 MHz) are higher than 1250 MHz. Therefore, it can be seen that the two frequencies ($f_1$=1830 MHz and $f_2$=2340 MHz) are sufficiently included in the passband.

Figure 11:
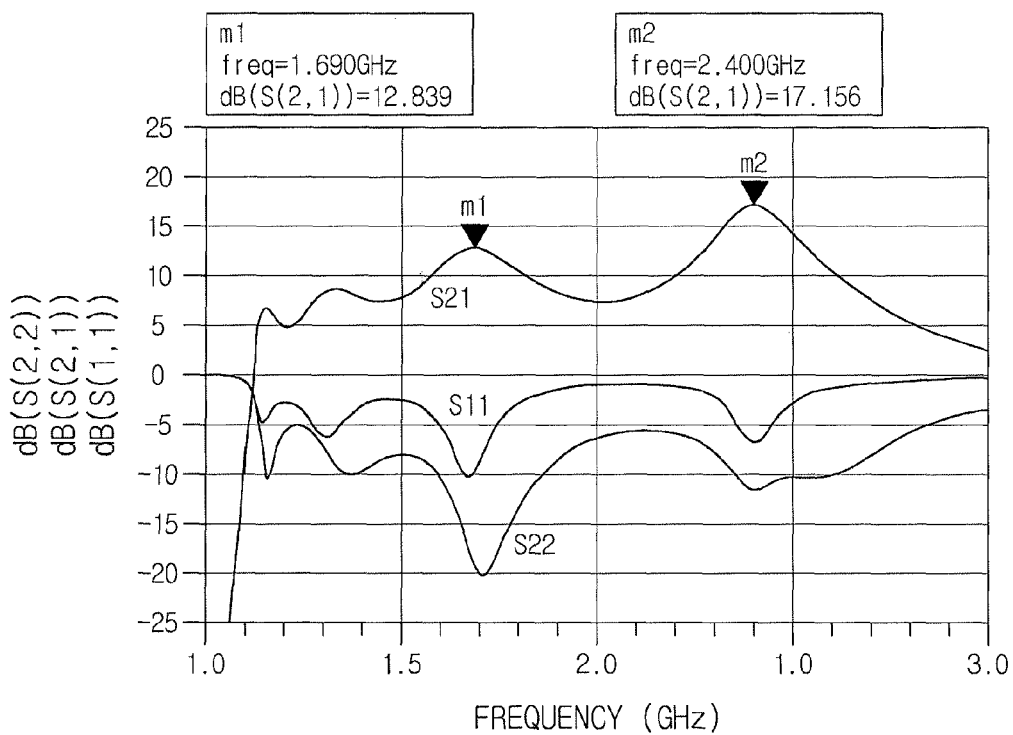
FIG. 11 is a graph showing designed characteristics (S-parameters) of a dual band high frequency amplifier using a CRLH TL according to an embodiment.

FIG. 11 is a graph showing designed characteristics (S-parameters) of a dual band high frequency amplifier using a CRLH TL according to an embodiment.

Referring to FIG. 11, the gain characteristic of the dual band amplifier is similar to that shown in FIGS. 8a and 8b, except the slight movement of a frequency. Also, in the matching characteristics S11 and S22, the matching of the dual band amplifier is satisfactory in the dual band.

The plane view and performance of a dual band amplifier actually manufactured will be described as an example.

Figure 12A:
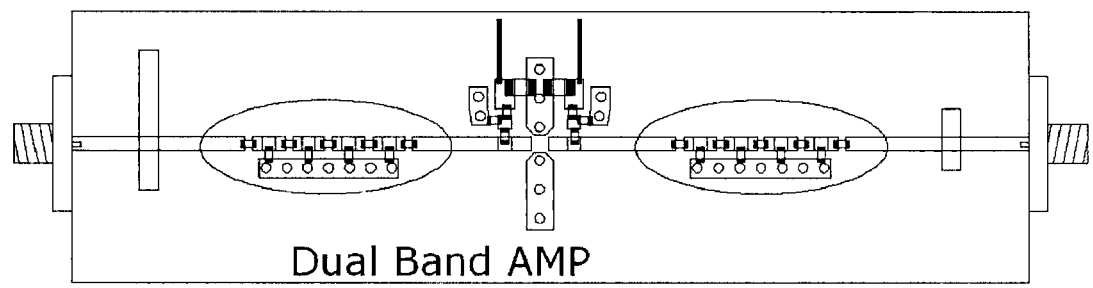
FIGS. 12a to 12c are a diagram showing a dual band high frequency amplifier using a CRLH TL according to an embodiment. Here.
Figure 12B:
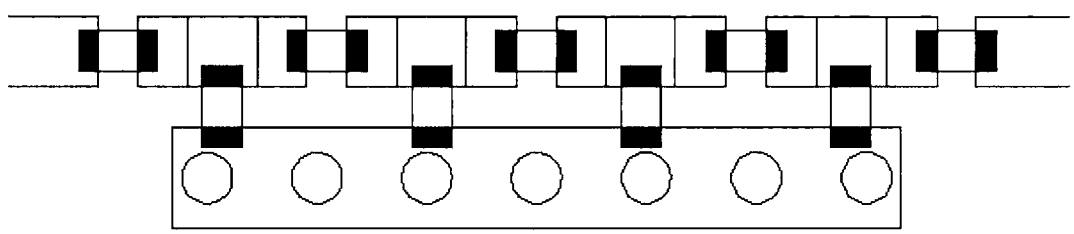
Figure 12C:
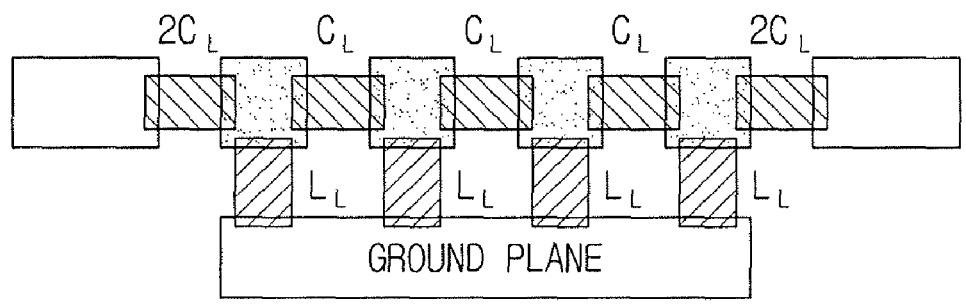

FIGS. 12a to 12c are a diagram showing a dual band high frequency amplifier using a CRLH TL according to an embodiment. Here, FIG. 12a is a plane view of the dual band high frequency amplifier, in which the matching circuit is configured with the CRLH TL, and FIG. 12b is an enlarged plane view of the matching circuit, and FIG. 12c is a diagram showing the layout of a matching circuit in the dual band high frequency amplifier using the CRLH TL according to an embodiment.

As shown in FIG. 12a, an amplifier of a microwave band and a dielectric substrate are used to design and manufacture the dual band high frequency amplifier as an embodiment. For example, a transistor device (part name: FHX35LG) is used for amplifiers of the microwave frequency band, and the dielectric substrate has a thickness of 20 mils and a dielectric constant of 2.55. Also, four unit LH TL structure as shown in FIG. 9c are inserted into the substrate including portions for the input and output matching circuits 20 and 30 of FIG. 5. Moreover, small-sized chip inductors and small-sized chip capacitors are used to implement the miniaturization of the LH TL structure. In order to solder and physical support the chip inductors and the chip capacitors, a short planar TL pad (corresponding to the RH TL) is inserted into each of the ports.

The four LH TLs in the dual band high frequency amplifier, which are marked with ellipses in FIG. 12a, are enlarged as shown in FIG. 12b. FIG. 12c illustrates an enlarged layout for the four LH TLs in the dual band high frequency amplifier using the CRLH TL according to the embodiment.

The configuration of the dual band high frequency amplifier designed and manufactured as described above will be described. Since capacitors are connected in series in the LH TL, direct current (DC) is substantially cut off. Therefore, the dual band amplifier does not require a DC cutoff device, e.g., a capacitor or coupled microstrip line filter, which is essentially inserted in the design of a general amplifier. Thus, a capacitor for DC cutoff is not completely required in the design of the amplifier using the CRLH TL.

Figure 13:
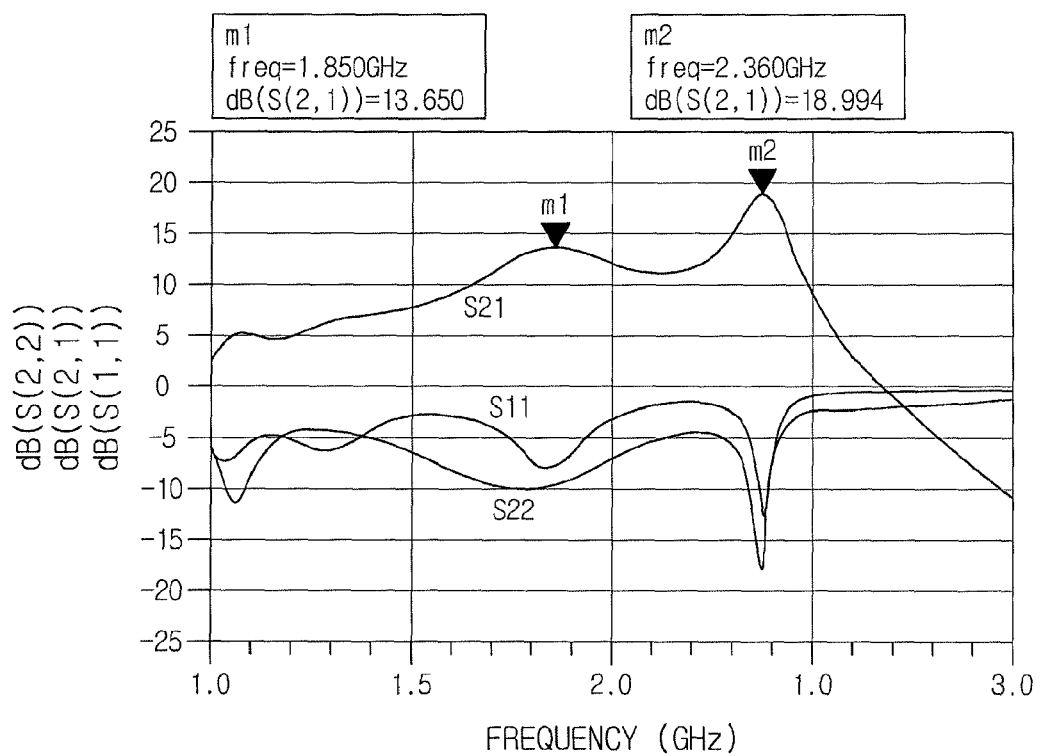
FIG. 13 is a graph showing actually measured characteristics of a dual band high frequency amplifier designed and manufactured as an embodiment.

FIG. 13 is a graph showing actually measured characteristics of a dual band high frequency amplifier designed and manufactured as an embodiment. The measured gain characteristics are 13.65 dB and 19 dB at frequencies of 1850 MHz and 2360 MHz, respectively. This shows that the measurement result has a slight frequency shift and an improvement in gain characteristic as compared with the simulation result. However, it can be seen that the measurement result is similar to the simulation result in consideration of errors caused by chip inductors and chip capacitors, which are actually used.

Since the matching characteristic is clearly observed at the dual band frequency having a gain characteristic, it can be seen that the gain characteristic in the dual band is not obtained by accident but obtained as the result that satisfactory matching is performed.

Thus, the validity of the technical spirit for the configuration of the dual band high frequency amplifier can be verified by the theoretical estimation values of FIG. 11 and the experimental values of FIG. 13.

Meanwhile, it has been described in this embodiment that the transistor device (FHX35LG) and the dielectric substrate with a thickness of 20 mils and a dielectric constant of 2.55 are used to design and manufacture the dual band high frequency amplifier. However, another transistor device may be used, and a dielectric substrate with any thickness or dielectric constant may be used.

Figure 14A:
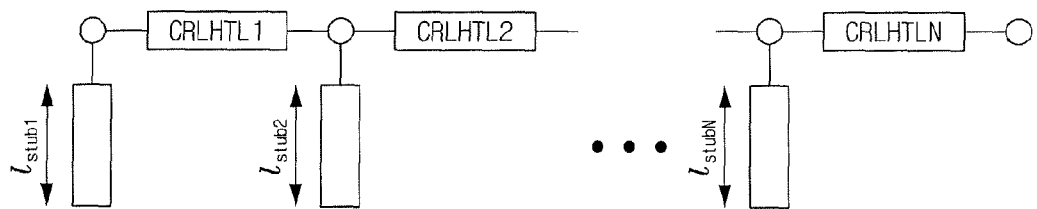
FIG. 14a is a diagram showing an example in which a matching circuit of a dual band high frequency amplifier is configured so that the number of CRLH TLs and the number of shunt stubs are identical.
Figure 14B:
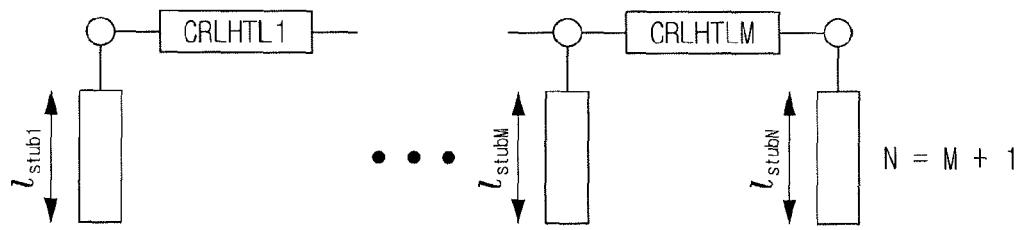
FIG. 14b is a diagram showing an example in which the matching circuit of the dual band high frequency amplifier is configured so that the number of CRLH TLs and the number of shunt stubs are different.
Figure 14C:
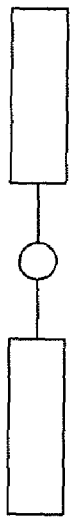
FIGS. 14c to 14e are diagrams showing examples in which shunt stubs constituting the matching circuit of the dual band high frequency amplifier are shunt-connected while being spaced apart at various angles.
Figure 14D:
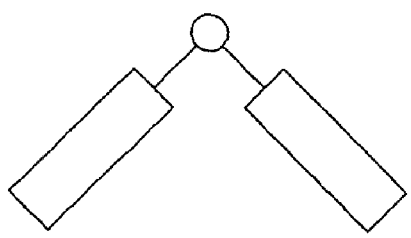
Figure 14E:
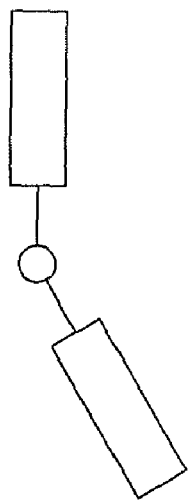

FIGS. 14a to 14e are diagrams showing a matching circuit of a dual band high frequency amplifier using a CRLH TL according to an embodiment. Here, FIG. 14a is a diagram showing an example in which a matching circuit of a dual band high frequency amplifier is configured so that the number of CRLH TLs and the number of shunt stubs are identical, and FIG. 14b is a diagram showing an example in which the matching circuit of the dual band high frequency amplifier is configured so that the number of CRLH TLs and the number of shunt stubs are different. FIGS. 14c to 14e are diagrams showing examples in which shunt stubs constituting the matching circuit of the dual band high frequency amplifier are shunt-connected while being spaced apart at various angles.

This embodiment is provided only for illustrative purposes, and the technical spirit disclosed herein can be identically implemented within the scope disclosed herein. That is, the dual band high frequency amplifier is not limited to the number of shunt stubs or CRLH TLs in the matching circuit as shown in FIGS. 14a and 14b. Specifically, the number N of shunt stubs may be identical to the number N of serial CRLH TLs in the matching circuit as shown in FIG. 14a, or the number N of shunt stubs may be more by one than the number M of serial CRLH TLs in the matching circuit as shown in FIG. 14b. In the shunt stubs of the matching circuit of FIGS. 14a and 14b, two shunt stubs may be connected to each other with a node positioned in the middle therebetween and disposed while being spaced apart at an angle of 180 degrees as shown in FIG. 14c. In the shunt stubs of the matching circuit of FIGS. 14a and 14b, two shunt stubs may be connected to each other with a node positioned in the middle therebetween and disposed while being spaced apart at an angle of below 90 degrees as shown in FIG. 14d. Alternatively, as shown in FIG.

14e, the two shunt stubs may be connected to each other with a node positioned in the middle therebetween and disposed while being spaced apart at an angle that is greater than 90 degrees and smaller than 180 degrees. The two shunt stubs shown in each of FIGS. 14c to 14e may have the same length or different lengths.

Thus, in this embodiment, CRLH TLs may be shunt-connected while the shunt stubs are spaced apart at various angles. This means that the technical spirit disclosed herein is not limited to the number of shunt stubs.

Also, this embodiment is provided only for illustrative purposes, and the technical spirit disclosed herein can be identically implemented within the scope disclosed herein. That is, the dual band high frequency amplifier is not limited to the step number of the amplifier including a one-stage amplifier or two- or more-stage amplifier, the configuration, operational mode and output power of the amplifier, the number of unit LH TLs, the kind or number of transistors, the thickness or dielectric constant of a dielectric substrate, the thickness of an upper/lower metal surface of the dielectric substrate, the kind and step number of a standardized RH TL (a microstrip TL, stripline TL, CPW TL, CPS TL, or the like) to constitute the CRLH TL by being connected to the LH TL, the dual band frequency to be used, the number of multiple bands (if the CRLH TL shows the characteristic of a dual band, the amplifier becomes a dual band amplifier, and if the CRLH TL shows the characteristic of a triple band, the amplifier becomes a triple band amplifier), and the like. However, the dual band high frequency amplifier may be variously changed and modified.

Although any one of the two frequency bands is not used, the dual band high frequency amplifier may be used as a single band high frequency amplifier for the frequency band of the other used.

Also, this embodiment is provided only for illustrative purposes, and the technical spirit disclosed herein can be identically implemented within the scope disclosed herein. That is, various types of inductors and capacitors may be used as the inductors and capacitors for the configuration of the LH TL, in addition to chip type inductors and capacitors. Specifically, the inductor may include various types of inductors such as a printed circuit board (PCB) pattern type inductor, a coil type inductor, a lumped element type inductor with a lead line, and a ferrite core type inductor. The capacitor may include various types of capacitors such as a PCB embedded capacitor, an electrolytic capacitor and a tantalum capacitor. Also, the inductors or capacitors may include at least one inductor or capacitor of which inductance or capacitance is variable.

Thus, the dual band high frequency amplifier using the CRLH TL according to the embodiment may be applied various kinds of wireless circuits for communication/broadcasting/data service, wireless components, antennas, transmission/reception systems and the like, which require characteristics of single, dual, triple bands and the like.

Accordingly, in the dual band high frequency amplifier disclosed herein, a matching circuit having an excellent matching characteristic at two frequency bands is configured using a CRLH TL having different phase angles (electrical lengths) in a dual band, thereby obtaining both gain and matching characteristics in the dual band.

While the invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A dual band high frequency amplifier using a composite right/left handed (CRLH) transmission line (TL), the amplifier comprising:
    an amplifier element having an amplification function; and
    a matching circuit having an impedance matching function of the amplifier element,
    wherein the matching circuit has one or more serial CRLH TLs and one or more shunt stubs, formed on a substrate, the serial CRLH TL has a plurality of unit left handed (LH) and right handed (RH) TLs, and the unit LH TL has serial capacitors and shunt inductors, thereby obtaining both gain and matching characteristics in a dual band.

2. The amplifier according to claim 1, wherein the matching circuit is any one of a matching circuit disposed at an input port of the amplifier element, a matching circuit disposed at an output port of the amplifier element, and matching circuits respectively disposed at the input and output ports of the amplifier elements.

3. The amplifier according to claim 1, wherein the plurality of unit LH TLs includes one or more of one or more serial capacitors with variable capacitance and one or more shunt inductors with variable inductance.

4. The amplifier according to claim 1, wherein the shunt stub are connected to a plurality of shunt stubs at one node and disposed while being spaced apart at predetermined angles.

5. The amplifier according to claim 1, wherein the RH TL includes any one of a microstrip TL, a stripline TL, a coplanar waveguide (CPW) TL and a coplanar strip (CPS) TL.

* * * * *